(12) United States Patent
Shen et al.

(10) Patent No.: US 10,600,832 B2
(45) Date of Patent: Mar. 24, 2020

(54) CAMERA MODULE

(71) Applicant: NANCHANG O-FILM OPTICAL-ELECTRONIC TECH CO., LTD., Nanchang (CN)

(72) Inventors: Chengzhe Shen, Nanchang (CN); Jun Feng, Nanchang (CN); Shumin Zhu, Nanchang (CN); Shengyun Zhang, Nanchang (CN); Wenhua Shuai, Nanchang (CN); Dong Tang, Nanchang (CN)

(73) Assignee: NANCHANG O-FILM OPTICAL-ELECTRONIC TECH CO., LTD., Nanchang (CN)

( * ) Notice: Subject to any disclaimer, the term of this patent is extended or adjusted under 35 U.S.C. 154(b) by 0 days.

(21) Appl. No.: 16/132,260

(22) Filed: Sep. 14, 2018

(65) Prior Publication Data

US 2019/0088698 A1 Mar. 21, 2019

(30) Foreign Application Priority Data

Sep. 15, 2017 (CN) .................. 2017 2 1186519 U

(51) Int. Cl.
*H01L 27/146* (2006.01)
*H04N 5/225* (2006.01)

(52) U.S. Cl.
CPC .. *H01L 27/14618* (2013.01); *H01L 27/14625* (2013.01); *H01L 27/14636* (2013.01); *H04N 5/2253* (2013.01); *H04N 5/2254* (2013.01)

(58) Field of Classification Search
CPC ......... H01L 27/14618; H01L 27/14625; H01L 27/14636; H01L 5/2253; H01L 5/2254
See application file for complete search history.

(56) References Cited

U.S. PATENT DOCUMENTS

| | | | | |
|---|---|---|---|---|
| 6,603,183 B1* | 8/2003 | Hoffman | ........... | H01L 27/14618 257/432 |
| 2011/0096219 A1* | 4/2011 | Lee | ................... | H01L 27/14618 348/308 |
| 2016/0118427 A1* | 4/2016 | Hsu | ................... | H01L 27/14618 257/434 |
| 2018/0007244 A1 | 1/2018 | Wang et al. | | |
| 2019/0086771 A1 | 3/2019 | Shen et al. | | |
| 2019/0088699 A1 | 3/2019 | Shen et al. | | |
| 2019/0089881 A1 | 3/2019 | Shen et al. | | |
| 2019/0089882 A1 | 3/2019 | Shen et al. | | |
| 2019/0089883 A1 | 3/2019 | Shen et al. | | |

(Continued)

OTHER PUBLICATIONS

U.S. Office Action dated Oct. 7, 2019, issued on U.S. Appl. No. 16/132,295 in the name of Nanchang O-Film Optical-Electronic Tech Co., Ltd.

*Primary Examiner* — Sitaramarao S Yechuri
(74) *Attorney, Agent, or Firm* — Franklin & Associates International Inc; Matthew F. Lambrinos

(57) ABSTRACT

A camera module includes a circuit board, a photosensitive chip located on the circuit board and electrically coupled to the circuit board, a package body packaged on the circuit board, and a bracket located on a side of the package body away from the circuit board. The package body includes a bearing surface away from the circuit board, and the bracket includes a first surface adjacent to the package body. A ratio between an area of the first surface and an area of the bearing surface is about 0.5 to about 1.2.

19 Claims, 6 Drawing Sheets

(56) References Cited

U.S. PATENT DOCUMENTS

| | | |
|---|---|---|
| 2019/0089884 A1 | 3/2019 | Shen et al. |
| 2019/0089885 A1 | 3/2019 | Shen et al. |
| 2019/0148429 A1 | 5/2019 | Wang et al. |
| 2019/0165019 A1 | 5/2019 | Wang et al. |

* cited by examiner

US 10,600,832 B2

CAMERA MODULE

CROSS REFERENCE TO RELATED APPLICATIONS

This application claims priority under 35 U.S.C. § 119 to Chinese Patent Application No. 2017211865199, entitled "CAMERA MODULE" filed on Sep. 15, 2017, the entire content of which is incorporated herein in its entirety.

TECHNICAL FIELD

The present disclosure relates to camera technologies, and particularly relates to a camera module.

BACKGROUND

Referring to FIG. 1, a conventional camera module 10 includes a circuit board 11, a photosensitive chip 12 located on the circuit board 11, a package body 13 packaged on the circuit board 11 and extending onto the photosensitive chip 12, electronic components 14 and conductive lines 15 packaged in the package body 13, a filter 16, and a lens assembly including a barrel 17 and a lens (not shown) provided in the barrel 17. A step portion configured to dispose the filter 16 is defined on a surface of the package body 13 away from the circuit board 11. The surface of the package body 13 away from the circuit board 11 is further used to support to the barrel 17. As a carrier for the filter 16 and the lens assembly, the package body 13 is required to have a certain strength, which requires the package body 13 to have a certain size in each of three directions along X, Y, and Z axes. However, as an optical axis 10a of the camera module 10 is parallel to the Z axis, the greater the length of the package body 13 in the Z axis direction, the more difficult for controlling a center line of a light transmission hole of the package body 13 to be coincided with the optical axis 10a during forming the package body 13 by using a mold, which makes it even more difficult to obtain a camera module with higher imaging quality.

SUMMARY

According to various embodiments of the present disclosure, a camera module is provided.

A camera module includes a circuit board, a photosensitive chip located on the circuit board and electrically coupled to the circuit board, a package body packaged on the circuit board, and a bracket located on a side of the package body away from the circuit board. The package body includes a bearing surface away from the circuit board, and the bracket includes a first surface adjacent to the package body. A ratio between an area of the first surface and an area of the bearing surface is about 0.5 to about 1.2.

The above and other features of the invention including various novel details of construction and combinations of parts, and other advantages, will now be more particularly described with reference to the accompanying drawings and pointed out in the claims.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawing.

DETAILED DESCRIPTION OF THE EMBODIMENTS

Embodiments of the invention are described more fully hereinafter with reference to the accompanying drawings, in which preferred embodiments of the invention are shown. The various embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art.

Figure 1:
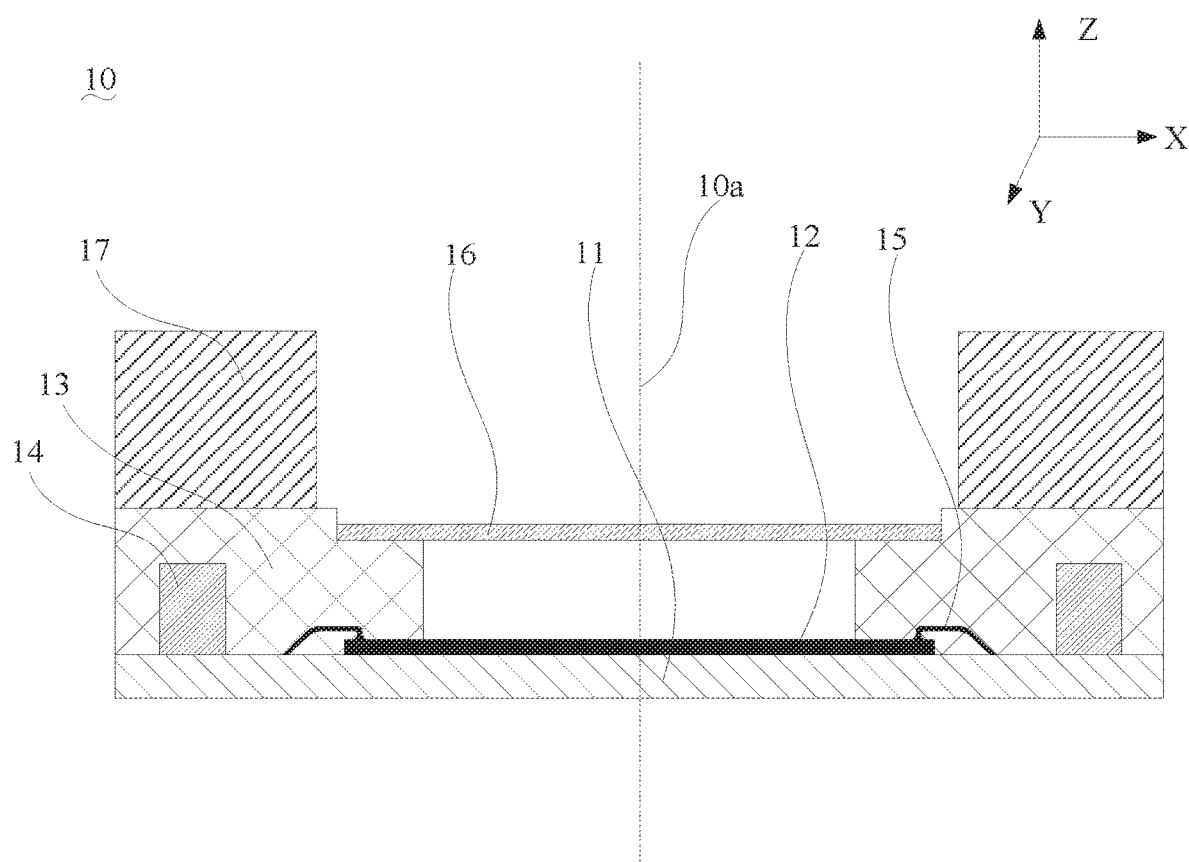
FIG. 1 is a cross-sectional view of a conventional camera module.
Figure 2:
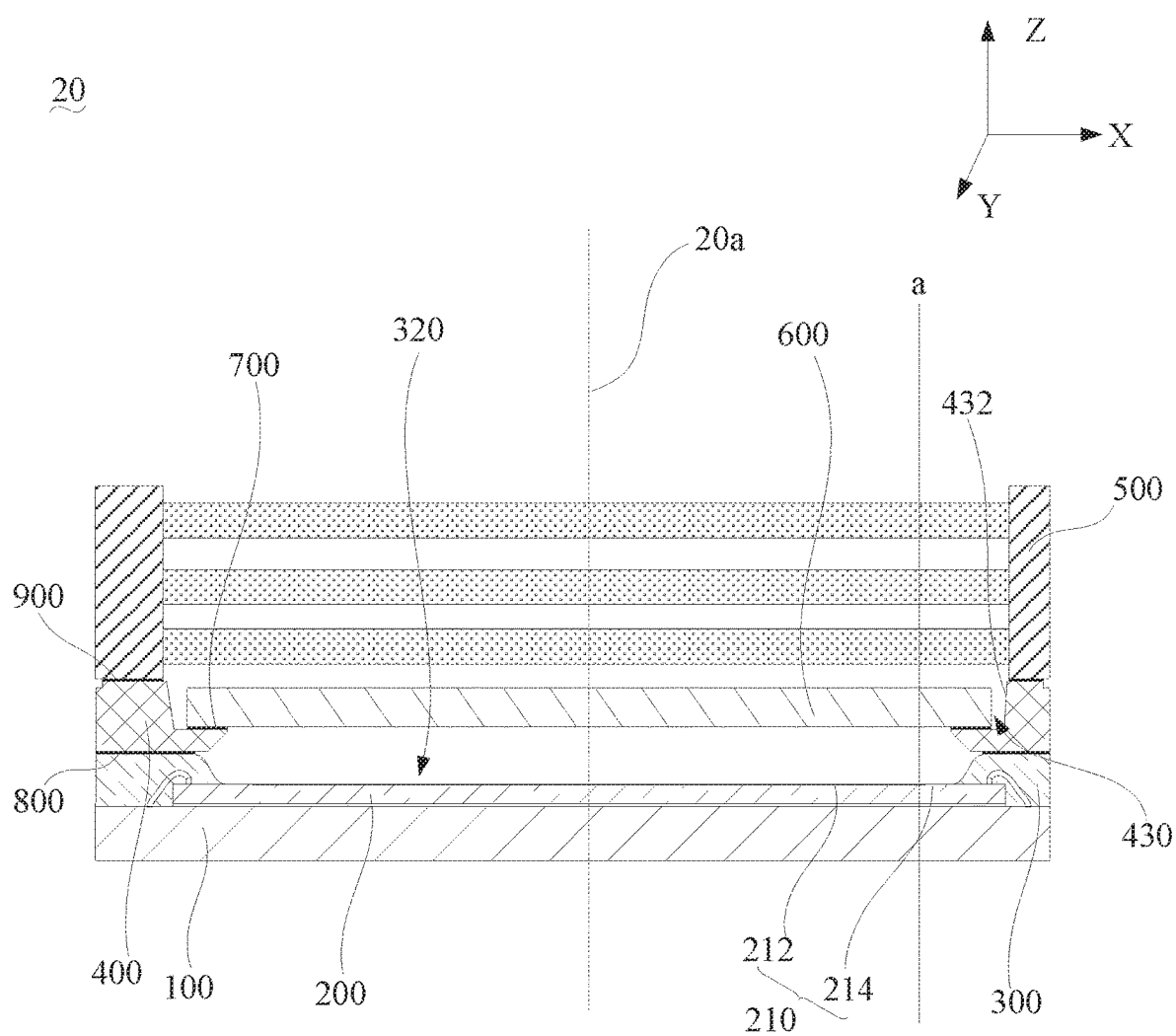
FIG. 2 is a cross-sectional view of a camera module in accordance with an embodiment.

Referring to FIG. 2, a camera module 20 in accordance with an embodiment can be of a rectangular shape, a cylindrical shape, or the like. In a space coordinate system, the camera module 20 has a certain length in an X-axis direction, a certain width in a Y-axis direction, and a certain distance in a Z-axis direction. The camera module 20 has an optical axis 20a, which is parallel to the Z axis. The camera module 20 includes a circuit board 100, a photosensitive chip 200, a package body 300, a bracket 400, a lens assembly 500, and a filter 600.

The photosensitive chip 200 is located on and electrically coupled to the circuit board 100. The photosensitive chip 200 includes a photosensitive surface 210 away from the circuit board 100. The photosensitive surface 210 includes a photosensitive region 212 and a non-photosensitive region 214 surrounding the photosensitive region 212. A boundary between the photosensitive region 212 and the non-photosensitive region 214 is indicated by a broken line a.

Figure 3:
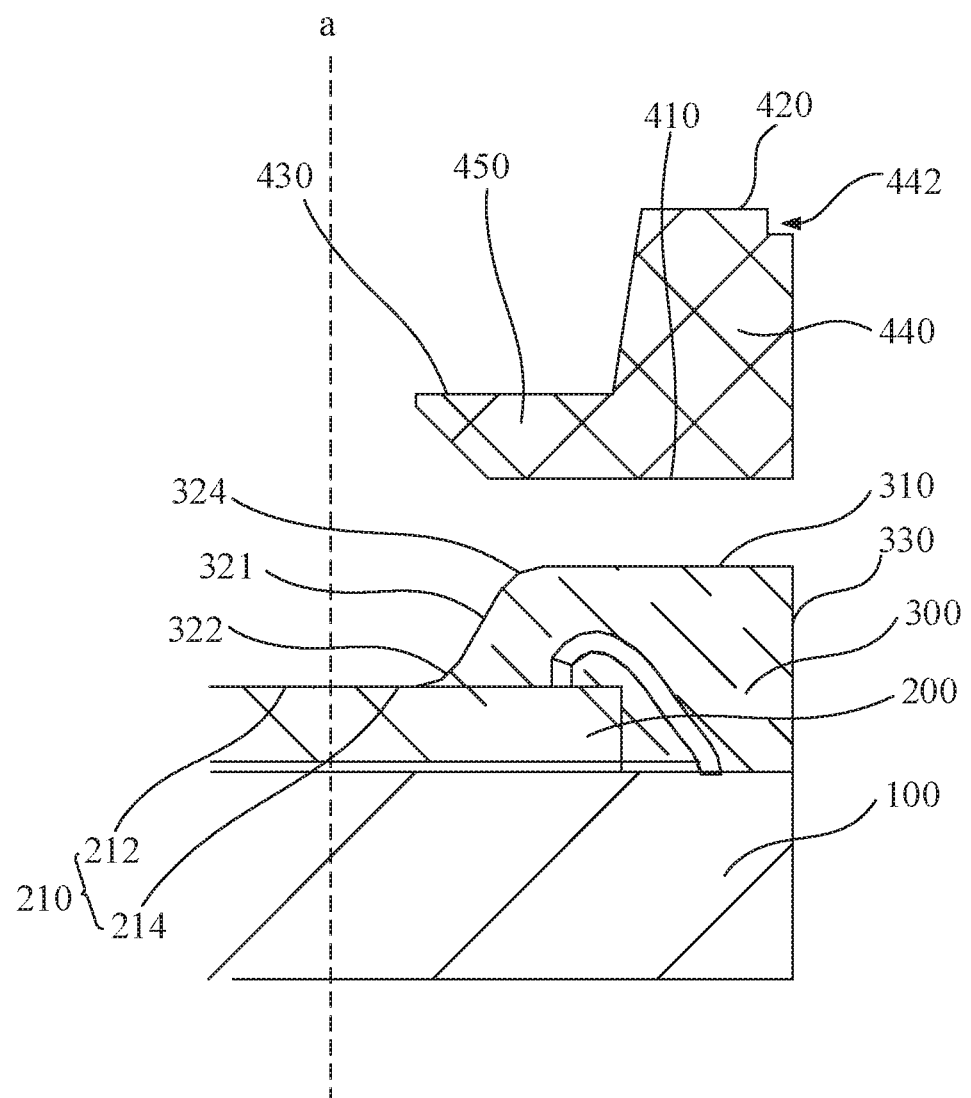
FIG. 3 is an enlarged view illustrating a package body and a bracket of FIG. 2.

Referring to FIGS. 2 and 3, the package body 300 is packaged on the circuit board 100. In the illustrated embodiment, the package body 300 encapsulates a portion of the non-photosensitive region 214, which enhances a connection between the photosensitive chip 200 and the circuit board 100. The remaining portion of the non-photosensitive region 214 is exposed to the outside. During the formation of the package body 300, if the material for forming the package body 300 leaks, the exposed portion of the non-photosensitive region 214 can receive the leaked material, thereby preventing the material for forming the package body 300 from flowing to the photosensitive region 212. In addition, when the package body 300 extends towards an inside of the non-photosensitive region 214, the size of the package body 300 in the XY plane can be reduced without changing the bearing strength of the package body 300.

The package body 300 includes a bearing surface 310 away from the circuit board 100. The bearing surface 310 is used to hold the bracket 400. The package body 300 defines a light transmission hole 320 in a middle portion thereof corresponding to the photosensitive surface 210. The light transmission hole 320 includes a sidewall 321. In the illustrated embodiment, the sidewall 321 is inclined with respect to the optical axis 20a, and a distance between the sidewall 321 and the optical axis 20*a* gradually increases along a direction from the circuit board 100 to the package body 300, which, on the one hand, can increase the luminous flux incident to the photosensitive surface 210, and on the other hand facilitate a demolding of an injection mold for forming the package body 300 and avoid damage to the package body 300.

The package body 300 further includes an outer sidewall 330. In the illustrated embodiment, a bottom of the light transmission hole 310 is a concave surface 322 recessed towards the outer sidewall 330, which can facilitate the demolding of the injection mold for forming the package body 300 and avoid damage to the package body 300, thereby improving the imaging quality of the camera module 20.

In the illustrated embodiment, a first round chamfer 324 is provided at a junction of the sidewall 321 and the bearing surface 310, which can facilitate the demolding of the injection mold for forming the package body 300 on the one hand, and reduce a flow speed of adhesive and deposit excessive adhesive on the other hand when attaching the bracket 400 and the package body 300, since the round chamfer has a greater resistance to the flow of the adhesive compared to an inclined surface. In addition, the round chamfer has a larger surface area compared to the inclined surface and can receive more adhesive, thus the adhesive can be effectively prevented from flowing to the photosensitive region 212.

Figure 4:
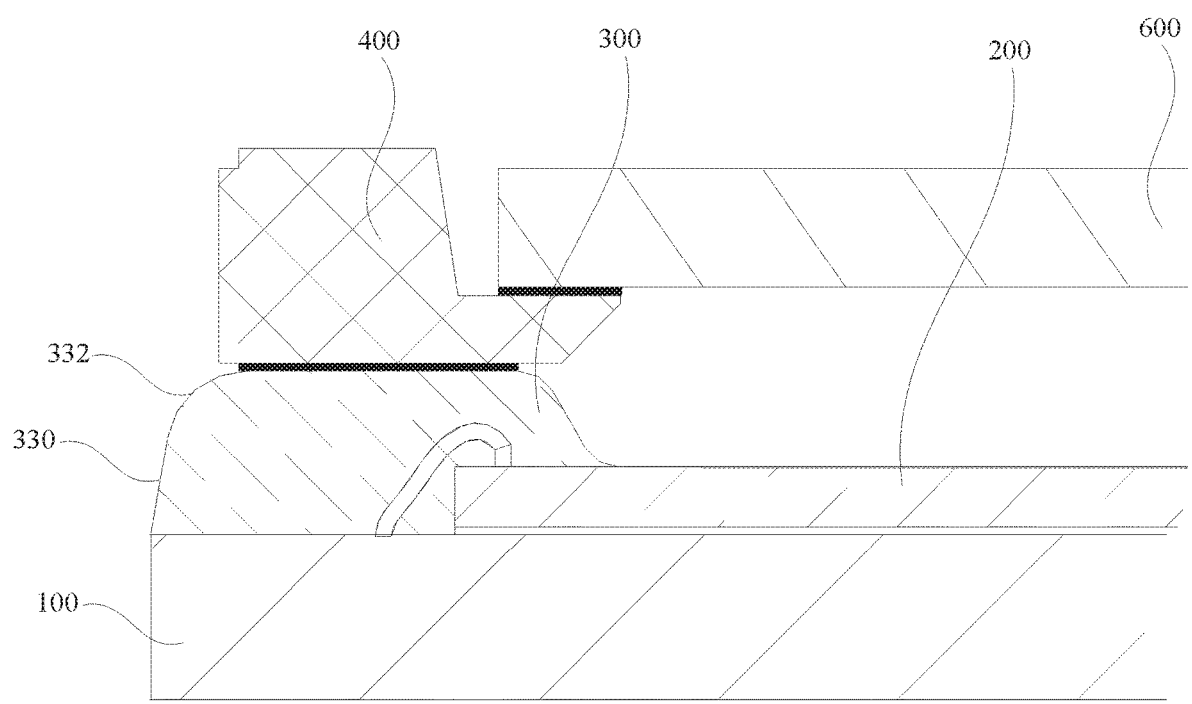
FIG. 4 is an enlarged view illustrating a left side of a camera module in accordance with another embodiment.

In the illustrated embodiment of FIG. 4, the outer sidewall 330 is inclined with respect to the optical axis 20*a*, and a distance between the outer sidewall 330 and the optical axis 20*a* gradually decreases along the direction from the circuit board 100 to the package body 300. In the illustrated embodiment, a second round chamfer 332 is provided at a junction of the outer sidewall 330 and the bearing surface 310, which can facilitate the demolding of the injection mold for forming the package body 300 and avoid damage to the package body 300.

Figure 5:
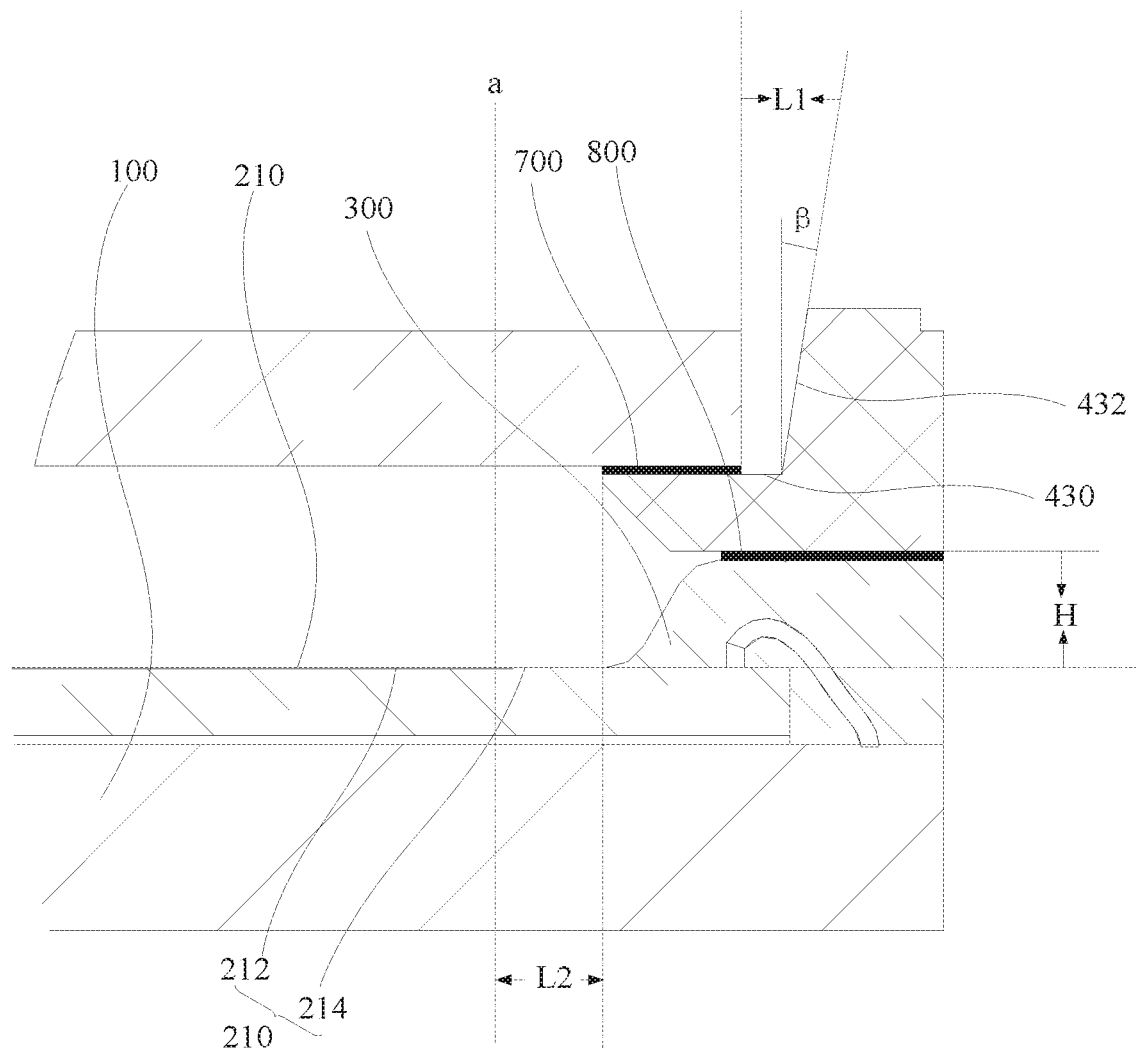
FIG. 5 is an enlarged view illustrating a tight side of the camera module of FIG. 2.

Referring to FIGS. 2, 3, and 5, the bracket 400 is located on the bearing surface 310. The bracket 400 includes a first surface 410 contacting the bearing surface 310 and a second surface 420 opposite to the first surface 410. A ratio between an area of the first surface 410 and an area of the bearing surface 310 is about 0.5 to about 1.2. If the ratio between the area of the first surface 410 and the area of the bearing surface 310 is less than 0.5, the bracket 400 cannot support the lens assembly 500 mounted thereon, such that the quality of the camera module 20 cannot be guaranteed. If the ratio between the area of the first surface 410 and the area of the bearing surface 310 is greater than 1.2, the bracket 400 may block the light emitted to the photosensitive chip 200, thereby affecting the imaging quality.

In the illustrated embodiment, an orthographic projection of the first surface 410 on the bearing surface 310 is located within the bearing surface 310. A vertical distance H between the first surface 410 and the photosensitive surface 210 ranges from about 150 μm to about 1500 μm, which can prevent light from being blocked by the bracket 400, thereby improving an imaging quality of the camera module 20. In one embodiment, the vertical distance H ranges from about 200 μm to about 500 μm. Specifically, in the illustrated embodiment, the vertical distance H is 260 μm. In alternative embodiments, the vertical distance H ranges from about 500 μm to about 1000 μm.

The bracket 400 includes a bracket body 440 and an extension structure 450. The extension structure 450 is located on a lower portion of an inner sidewall 432 of the bracket body 440. In the illustrated embodiment, an orthographic projection of the extension structure 450 on the photosensitive surface 210 is located within the non-photosensitive region 214 and spaced apart from the photosensitive region 212, thereby preventing the extension structure 450 from blocking light emitted to the photosensitive region 212, such that the camera module 20 can have a good imaging quality.

A distance L2 between an edge of the orthographic projection of the extension structure 450 on the photosensitive surface 210 and the photosensitive region 212 ranges from about 100 μm to about 500 μm, which can prevent the extension structure 450 from blocking the light emitted to the photosensitive region 212, and it can ensure that the extension structure 450 and the bearing surface 310 have a large enough connection area, thereby firmly connecting the bracket 400 and package body 300. In one embodiment, the distance L2 ranges from about 200 μm to about 400 μm. Specifically, in the illustrated embodiment, the distance L2 is 300 μm.

Figure 6:
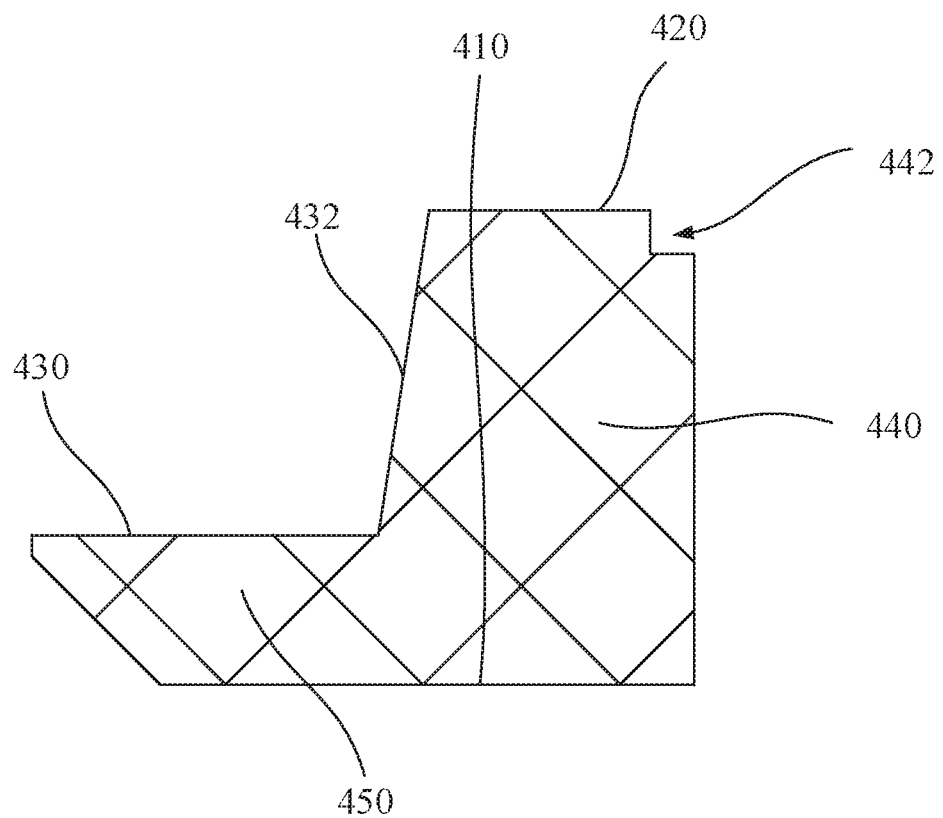
FIG. 6 is an enlarged view illustrating a right side of the bracket of FIG. 2.

Referring to FIGS. 2, 5, and 6, the extension structure 450 has a support surface 430 used to support the filter 600. The inner sidewall 432 of the bracket body 440 is inclined with respect to the optical axis 20*a*. A distance between the inner sidewall 432 and the optical axis 20*a* gradually increases along a direction from the circuit board 100 to the bracket 400. The inclined inner sidewall 432 can reduce the flow speed of the adhesive and deposit excessive adhesive when attaching the lens assembly 500 and the bracket 400 due to that the inclined sidewall 432 has a greater resistance to the flow of the adhesive than a vertical surface, and can receive more adhesive due to a greater area of the inclined sidewall 432 than that of a vertical surface.

In the illustrated embodiment, an angle β between the inner sidewall 432 and the optical axis 20*a* ranges from about 0.5° to about 30°, In one embodiment, the angle β ranges from about 1° to about 10°, thereby ensuring the strength of the bracket 400 for stably supporting the lens assembly 500.

In the illustrated embodiment, the bracket body 440 defines a recess 442 on an outer sidewall thereof away from the package body 300, which can be used to receive excess adhesive when attaching the lens assembly 500 and the bracket 400, thereby preventing the adhesive from flowing along the outer sidewall of the bracket 400.

The lens assembly 500 is located on a top side of the bracket 400 away from the package body 300. In the illustrated embodiment, the lens assembly 500 is located on the bracket body 440.

In the illustrated embodiment, each end of the filter 600 is located on the support surface 430 and is spaced apart from the bracket body 440, thus a gap L1 is defined between the filter 600 and the bracket body 440. The existence of the gap L1 can prevent the bracket body 440 from extruding and breaking the filter 600 when mounting the filter 600. In addition, the gap L1 can receive excessive adhesive when attaching the filter 600 and the bracket 400 and attaching the lens assembly 500 and the bracket 400.

It should be understood that, in the illustrated embodiment, the camera module 20 further includes a first adhesive layer 700 located between the extension structure 450 and the filter 600, a second adhesive layer 800 located between the bearing surface 320 and the first surface 410, and the third adhesive layer 900 located between the lens assembly 500 and the bracket body 440.

Compared with a conventional two-stage structure composed of a package body and a lens assembly, the aforementioned camera module 20 has a three-stage structure composed of the package body 300, the bracket 400, and the lens assembly 500, where partial bracket body in the conventional two-stage structure is replaced by the bracket, such that the formed package body 300 can have a relatively small length in the Z-axis direction. The smaller the length of the package body 300 in the Z-axis direction, the easier for controlling an alignment of the optical axis 20a of the camera module, thereby obtaining a camera module 20 with a higher imaging quality.

During assembling of the camera module 20, the package body 300 with a relatively small length in the Z axis direction is formed in advance by using a fabrication process, and the center line of the light transmission hole 320 of the package body 300 is aligned with the optical axis 20a while forming the package body 300. Then, the bracket 400 provided with the filter 600 is located on the package body 300. Specifically, the adhesive is coated on the first surface 410 or the bearing surface 310, and the alignment between the center line of the bracket 400 and the optical axis 20a can be adjusted by adjusting the thickness of the adhesive. Finally, the adhesive is coated on the second surface 420 or the connecting side surface of the lens assembly 500, and the alignment between the center line of lens assembly 500 and the optical axis 20a can be adjusted by adjusting the thickness of the adhesive. The alignments between the center line of the bracket 400 and the optical axis 20a and between the center line of the lens assembly 500 and the optical axis 20a are staged controlled, which can reduce the control difficulty of each stage, thereby reducing the processing difficulty for manufacturing the camera module 20.

It should be understood that, in alternative embodiments, the photosensitive chip 200 is completely exposed from the light transmission hole 320 and spaced apart from an inner wall of the light transmission hole 320, in that case, the package body 300 does not encapsulate the non-photosensitive region 214 of the photosensitive chip 200.

It should be understood that, in alternative embodiments, the shape and size of the first surface 410 match the shape and size of the bearing surface 310, and the orthographic projection of the first surface 410 on the bearing surface 310 can coincide with the bearing surface 310 to ensure that the bracket 400 and the package body 300 can be completely attached, thereby firmly connecting the bracket 400 with the package body 300.

It should be understood that, in alternative embodiments, the recess 442 can be omitted.

It should be understood that, in alternative embodiments, the photosensitive surface 210 can merely include the photosensitive region 212.

Although the respective embodiments have been described one by one, it shall be appreciated that the respective embodiments will not be isolated. Those skilled in the art can apparently appreciate upon reading the disclosure of this application that the respective technical features involved in the respective embodiments can be combined arbitrarily between the respective embodiments as long as they have no collision with each other. Of course, the respective technical features mentioned in the same embodiment can also be combined arbitrarily as long as they have no collision with each other.

The foregoing descriptions are merely specific embodiments of the present invention, but are not intended to limit the protection scope of the present invention. Any variation or replacement readily figured out by a person skilled in the art within the technical scope disclosed in the present invention shall all fall within the protection scope of the present invention. Therefore, the protection scope of the present invention shall be subject to the protection scope of the appended claims.

What is claimed is:

1. A camera module, comprising:
a circuit board;
a photosensitive chip located on the circuit board and electrically coupled to the circuit board;
a package body packaged on the circuit board; and
a bracket located on a side of the package body away from the circuit board;
wherein the package body comprises a bearing surface away from the circuit board, the bracket comprises a first surface adjacent to the package body, a ratio between an area of the first surface and an area of the bearing surface is about 0.5 to about 1.2; and
wherein the package body defines a light transmission hole in a middle portion thereof, a bottom of the light transmission hole is a concave surface recessed towards an outer sidewall of the package body.

2. The camera module according to claim 1, wherein the package body defines a light transmission hole in a middle portion thereof, a sidewall of the light transmission hole is inclined with respect to an optical axis of the camera module, a distance between the sidewall of the light transmission hole and the optical axis of the camera module gradually increases along a direction from the circuit board to the package body.

3. The camera module according to claim 1, wherein the package body defines a light transmission hole in a middle portion thereof, a first round chamfer is provided at a junction of a sidewall of the light transmission hole and the bearing surface.

4. The camera module according to claim 1, wherein the package body defines a light transmission hole in a middle portion thereof, the package body further comprises an outer sidewall, the outer sidewall is inclined with respect to an optical axis of the camera module, a distance between the outer sidewall and the optical axis of the camera module gradually decreases along a direction from the circuit board to the package body.

5. The camera module according to claim 4, wherein a second round chamfer is provided at a junction of the outer sidewall and the bearing surface.

6. The camera module according to claim 1, wherein the photosensitive chip comprises a photosensitive surface away from the circuit board, a distance between the photosensitive surface and the first surface ranges from about 150 μm to about 1500 μm.

7. The camera module according to claim 6, wherein the distance between the photosensitive surface and the first surface ranges from about 200 μm to about 500 μm.

8. The camera module according to claim 6, wherein the distance between the photosensitive surface and the first surface ranges from about 500 μm to about 1000 μm.

9. The camera module according to claim 1, further comprising a lens assembly and a filter, wherein the bracket comprises a bracket body and an extension structure, the lens assembly is located on the bracket body, the filter is located on the extension structure.

10. The camera module according to claim 9, wherein each end of the filter is spaced apart from an inner sidewall of the bracket body.

11. The camera module according to claim 9, further comprising a first adhesive layer located between the extension structure and the filter, a second adhesive layer located between the bearing surface and the first surface, and a third adhesive layer located between the lens assembly and the bracket body.

12. The camera module according to claim 1, wherein the photosensitive chip comprises a photosensitive surface away from the circuit board, the photosensitive surface comprises a photosensitive region and a non-photosensitive region surrounding the photosensitive region, the package body encapsulates a portion of the non-photosensitive region.

13. The camera module according to claim 12, wherein the bracket comprises a bracket body and an extension structure, an orthographic projection of the extension structure on the photosensitive surface is spaced apart from the photosensitive region.

14. The camera module according to claim 13, wherein a distance between the orthographic projection of the extension structure on the photosensitive surface and the photosensitive region ranges from about 100 μm to about 500 μm.

15. The camera module according to claim 1, an orthographic projection of the first surface on the bearing surface is located within the bearing surface.

16. The camera module according to claim 1, wherein the bracket comprises a bracket body and an extension structure, an inner sidewall of the bracket body is inclined with respect to an optical axis of the camera module, a distance between the inner sidewall of the bracket body and the optical axis of the camera module gradually increases along a direction from the circuit board to the package body.

17. The camera module according to claim 16, wherein an angle between the inner sidewall of the bracket body and the optical axis ranges from about 0.5° to about 30°.

18. The camera module according to claim 17, wherein the angle between the inner sidewall of the bracket body and the optical axis ranges from about 1° to about 10°.

19. The camera module according to claim 1, wherein the bracket comprises a bracket body and an extension structure, the bracket body defines a recess on an outer sidewall of the bracket body away from the package body for receiving excess adhesive when attaching the lens assembly and the bracket.

* * * * *